United States Patent
Nakasuji

(10) Patent No.: US 6,337,164 B1
(45) Date of Patent: Jan. 8, 2002

(54) CHARGED-PARTICLE-BEAM MICROLITHOGRAPHY METHODS EXHIBITING IMPROVED PATTERN-FEATURE ACCURACY, AND DEVICE MANUFACTURING METHODS COMPRISING SAME

(75) Inventor: Mamoru Nakasuji, Yokohama (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/559,904

(22) Filed: Apr. 26, 2000

(30) Foreign Application Priority Data

May 7, 1999 (JP) .................................... 11-126937

(51) Int. Cl.$^7$ ................................................. G03F 9/00

(52) U.S. Cl. ........................ 430/30; 430/296; 430/942

(58) Field of Search ............................ 430/30, 296, 942

(56) References Cited

U.S. PATENT DOCUMENTS

| | | | |
|---|---|---|---|
| 5,689,117 A | 11/1997 | Nakasuji | 250/492.23 |
| 5,798,194 A | 8/1998 | Nakasuji et al. | 430/5 |
| 5,895,925 A | 4/1999 | Nakasuji | 250/492.22 |

*Primary Examiner*—Christopher G. Young
(74) *Attorney, Agent, or Firm*—Klarquist Sparkman LLP

(57) ABSTRACT

Apparatus and methods are disclosed for achieving improved pattern linewidth of a pattern microlithographically transferred to a sensitive substrate using a charged particle beam such as an electron beam. Improved linewidth is achieved even if beam-edge resolution is not optimal. The poorest value of beam-edge resolution of the projection-optical system used to project the reticle pattern onto the substrate is 0.8 to 1.0 times the minimum linewidth of the pattern. A variation in threshold value is maintained at approximately ±1%, allowing linewidth precision to be maintained at a value that is well within a target value of ±10%, even if the beam is 0.9 to 1.0 times the minimum linewidth.

12 Claims, 6 Drawing Sheets

CHARGED-PARTICLE-BEAM MICROLITHOGRAPHY METHODS EXHIBITING IMPROVED PATTERN-FEATURE ACCURACY, AND DEVICE MANUFACTURING METHODS COMPRISING SAME

FIELD OF THE INVENTION

This invention pertains to microlithography in which a pattern, defined on a mask or reticle, is transferred to a suitable substrate using a charged particle beam such as an electron beam. This type of microlithography has especial utility in the fabrication of semiconductor integrated circuits and displays. More particularly, the invention pertains to achieving accurate pattern-feature linewidths in the microlithographically projected pattern image even if beam-edge resolution is relatively poor.

BACKGROUND OF THE INVENTION

In recent years, as semiconductor integrated circuits increasingly have become miniaturized, the resolution limits of optical microlithography (i.e., microlithography performed using ultraviolet light as an energy beam) increasingly have become apparent. As a result, considerable development effort currently is being expended to develop microlithography apparatus and methods that employ an alternative type of energy beam that offers prospects of better resolution than optical microlithography. One candidate microlithography technology utilizes a charged particle beam, such as an electron beam or ion beam, as an energy beam. The charged particle beam passes through a charged-particle-beam (CPB)-optical system from a source (e.g., electron gun) through a reticle to a substrate (e.g., semiconductor wafer).

In conventional electron-beam microlithography, the beam-edge resolution of the electron-optical system desirably is no more than one-half to one-third the minimum linewidth of the pattern as imaged on the substrate. "Beam-edge resolution" is defined as the lateral distance over which the intensity of the beam at the beam edge increases from 12% to 88%. The lower the number denoting beam-edge resolution, the more sharply defined the beam edges. Hence, for example, if the minimum linewidth of the elements (features) of a pattern is 100 nm, then the beam-edge resolution desirably is 50 nm to 33 nm or less. However, a large beam current (i.e., a beam current of approximately 20 $\mu$A or more) can cause the beam-edge resolution to be greater than the required value due to the influence of space-charge effects. As used herein, "beam current" refers to the total current of the electron beam reaching a sensitive substrate at any one instant. A "space-charge effect" is a phenomenon in which similarly charged particles (e.g., electrons) in the beam repel each other in response to Coulomb forces between the similarly charged particles, resulting in beam spreading and consequent blurring (loss of beam-edge resolution) of the edges of the beam.

According to conventional practice, space-charge effects can be reduced by reducing the area of the substrate illuminated by the beam at any one instant and/or by reducing the beam current. Unfortunately, these tactics reduce "throughput" (number of semiconductor wafers that can be microlithographically processed per unit time) to impractical levels.

SUMMARY OF THE INVENTION

In view of the shortcomings of the prior art as summarized above, an object of the invention is to provide microlithography (pattern-transfer) methods that achieve accurate pattern-feature linewidths even if beam-edge resolution is relatively poor.

To such end, and according to a first aspect of the invention, methods are provided for performing microlithography of a pattern, defined on a reticle and having a minimum linewidth, to a sensitive substrate using a charged particle beam. According to a representative embodiment of such a method, a region of the reticle is illuminated with a charged-particle illumination beam passing through an illumination-optical system. The illumination beam passing through the illuminated region of the reticle forms a patterned beam propagating downstream of the reticle. The patterned beam is projected and focused, with demagnification, through a projection-optical system onto a corresponding region on a sensitive substrate. A minimum linewidth of the pattern defined by the reticle is determined. The projection-optical system is controlled to provide the patterned beam with a beam-edge resolution that is 0.8 to 1.0 times the minimum linewidth of the pattern.

If the beam-edge resolution is as noted above, linewidth accuracy and precision can be maintained at a value that is sufficiently better than the target value of ±10%, especially so long as the variation in the threshold value is maintained at ±1% or better.

According to another representative embodiment of methods according to the invention, the pattern as defined on the reticle is divided into multiple subfields. The subfields are illuminated successively with a charged-particle illumination beam to form a patterned beam propagating downstream of the reticle. The patterned beam from each subfield is projected and focused, with demagnification, by passage through a projection-optical system so as to form images of the subfields on respective regions on a sensitive substrate such that the images are stitched together. A predicted beam-edge resolution of the projection-optical system is calculated, based on a beam current used to illuminate each subfield. Before exposing a subfield on the reticle, dimensions of pattern features as defined in the subfield are corrected according to a ratio of pattern-feature dimension to the beam-edge resolution, so as to project the pattern features in the subfield with correct pattern-feature dimensions on the substrate.

By correcting the dimensions of the pattern features on the reticle beforehand, accuracy and precision of pattern dimensions can be increased, even in instances in which beam-edge resolution is relatively coarse.

According to yet another representative embodiment of a method according to the invention, the pattern, as defined on the reticle, is divided into multiple subfields. The subfields are illuminated successively with a charged-particle illumination beam to form a patterned beam propagating downstream of the reticle. The patterned beam is projected and focused, with demagnification, from each subfield through a projection-optical system so as to form images of the subfields on respective regions on a sensitive substrate such that the images are stitched together. A predicted beam-edge resolution of the projection-optical system is calculated, based on a beam current used to illuminate each subfield. The calculated beam-edge resolution is calculated as a function of a position, within a field of the projection-optical system, in which an image of the subfield is to be formed on the substrate. Before exposing a subfield on the reticle, dimensions of pattern features as defined in the subfield are corrected according to a ratio of pattern-feature dimension to the beam-edge resolution, so as to project the pattern features in the subfield with correct pattern-feature dimensions on the substrate.

Another representative embodiment is directed to a method for manufacturing an electronic device that includes at least one layer having a pattern formed by charged-particle-beam microlithography. (The microlithography involves illumination of a reticle, defining the pattern, by an illumination beam to form a patterned beam, and transferring of the pattern from the reticle to a sensitive substrate by reducing, projecting, and focusing the patterned beam onto the sensitive substrate. The method includes a method for controlling beam blur. In the latter method, the patterned beam is passed through a projection-optical system as the patterned beam propagates from the reticle to the sensitive substrate. A beam-edge resolution that is achievable with the projection-optical system is determined, and the projection-optical system is controlled such that a poorest beam-edge resolution achieved by the projection-optical system is 0.8 to 1.0 times a minimum linewidth of the pattern.

In another representative embodiment of a method for manufacturing an electronic device that includes at least one layer having a pattern formed by charged-particle-beam microlithography, a reticle defining the pattern is segmented into multiple subfields each defining a respective portion of the pattern. The subfield images are individually and sequentially projected onto the sensitive substrate in a manner in which images of the subfields on the sensitive substrate are stitched together. The method includes a method for forming an image on the sensitive substrate of the subfield in which the pattern-feature dimension is correctly formed. According to the latter method, the patterned beam is passed through a projection-optical system as the patterned beam propagates from the reticle to the sensitive substrate. A predicted value of beam-edge resolution of the projection-optical system is determined, based on a beam current used to expose each subfield on the reticle. Before exposing a subfield, a dimension of a pattern feature defined in the subfield is corrected according to a ratio of the pattern-feature dimension to the beam-edge resolution.

In yet another representative embodiment of a method, according to the invention, for manufacturing an electronic device that includes at least one layer having a pattern formed by charged-particle-beam microlithography, the reticle is segmented into multiple subfields, each defining a respective portion of the pattern. The subfields are individually and sequentially projected onto the sensitive substrate in a manner in which images of the subfields on the sensitive substrate are stitched together. This method also includes a method for forming an image of a subfield in which pattern-feature dimensions are correct. The latter method comprises passing the patterned beam through a projection-optical system as the patterned beam propagates from the reticle to the sensitive substrate. A predicted value of beam-edge resolution of the projection-optical system is determined, wherein the value is a function of a position, within a field of the projection-optical system, where the subfield pattern is transferred. Based on the determination and before projecting an image of a subfield, dimensions of the pattern features in the subfield are corrected according to a ratio of pattern-feature dimension to beam-edge resolution.

The foregoing and additional features and advantages of the invention will be more readily apparent from the following detailed description, which proceeds with reference to the accompanying drawings.

Figure 1:
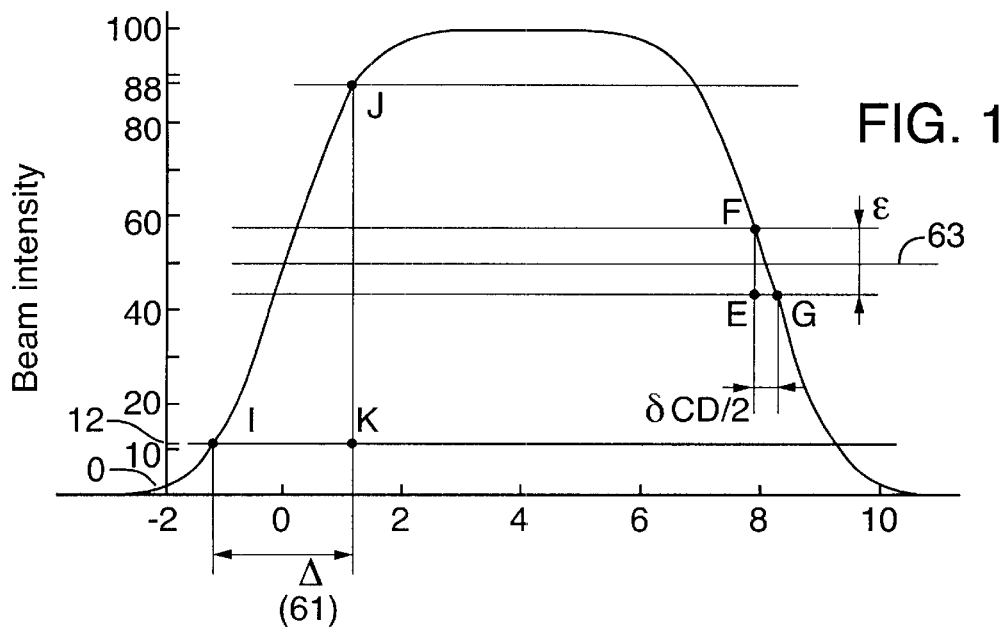
FIG. 1 is a graph showing representative relationships of beam-edge resolution, threshold value, and pattern-feature error in an instance in which the pattern-feature dimensions are substantially larger than the beam-edge resolution.

The reference numerals 72–77 indicate various respective exemplary levels of beam-edge resolution achieved in an example.

Figure 7:
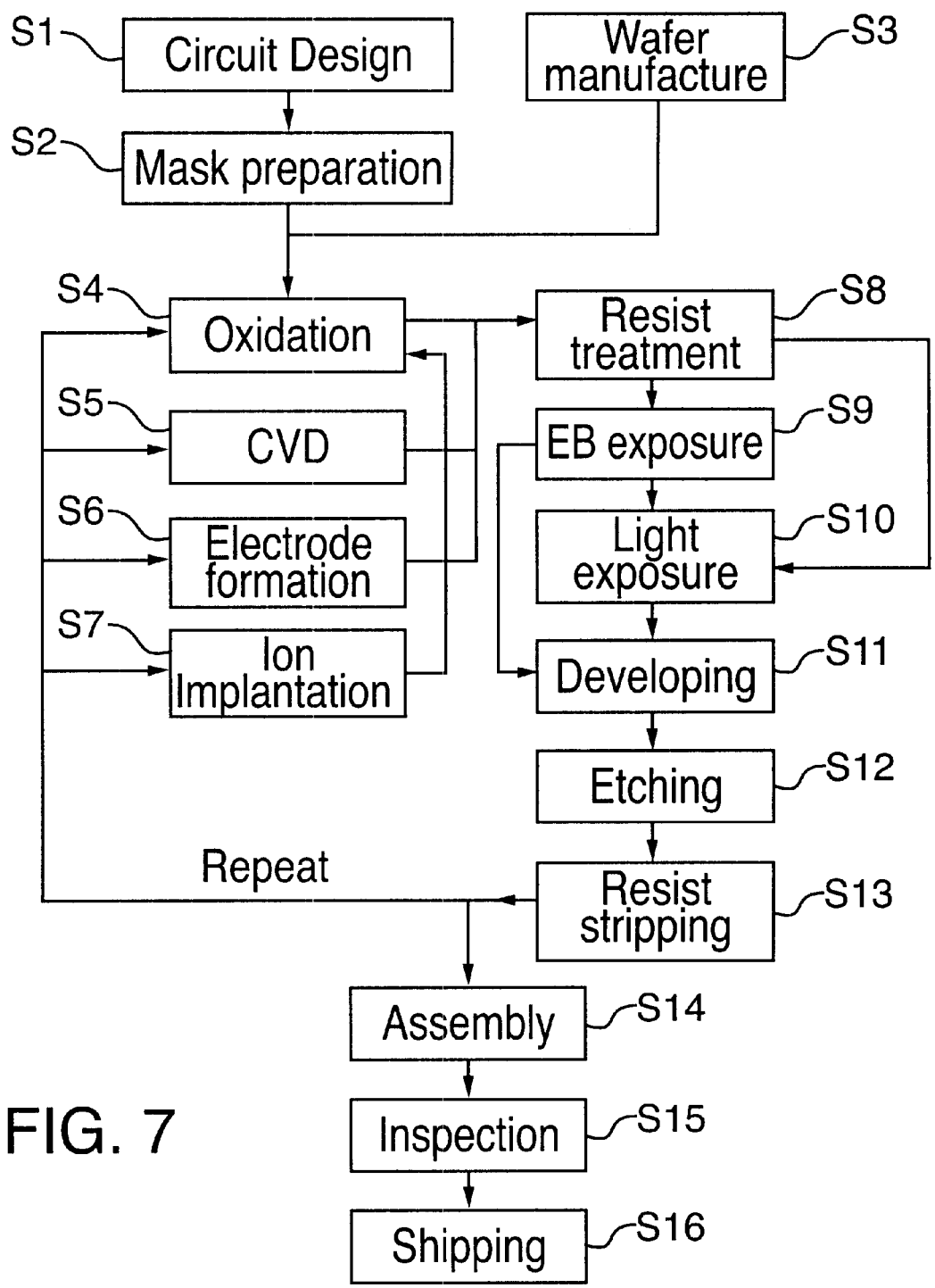

FIG. 7 is a flow chart of steps in a process for manufacturing a semiconductor device such as a semiconductor chip.

DETAILED DESCRIPTION

Figure 4:
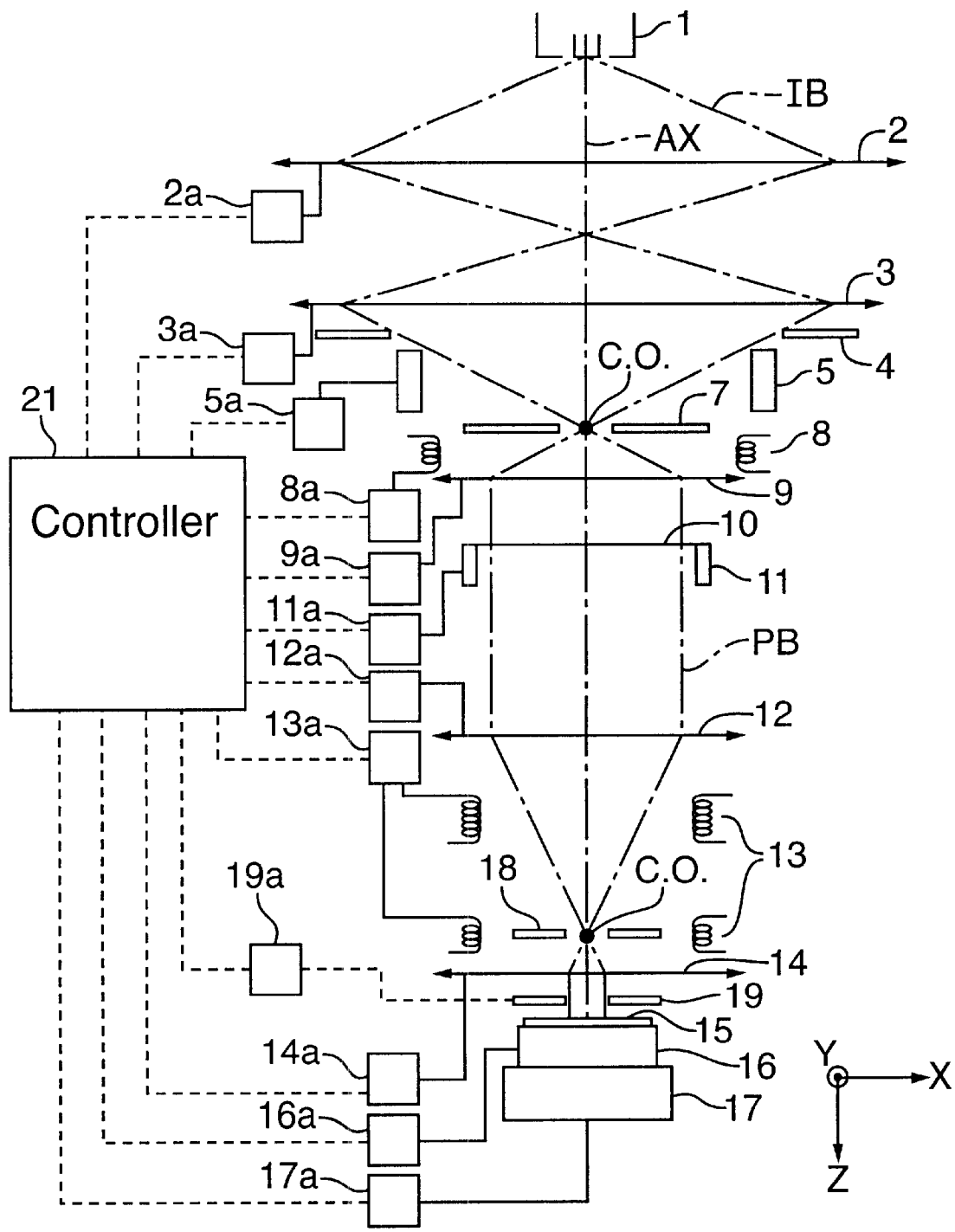
FIG. 4 is a schematic elevational view of various components, imaging relationships, and control systems of an electron-beam microlithography apparatus according to a representative embodiment of the invention.

Reference is first made to FIG. 4 that depicts an overall configuration of a representative embodiment of a charged-particle-beam (CPB) microlithography apparatus according to the invention. FIG. 4 also depicts certain imaging and control relationships of the CPB optical system of the apparatus. FIG. 4 is depicted and discussed in the context of an electron-beam system. However, it readily will be understood that the general principles discussed below can be applied with equal facility to an ion-beam system or the like.

An electron gun 1 is situated at the extreme upstream end of the optical system of FIG. 4. The electron gun 1 emits an electron beam (termed the "illumination beam" IB) in a downstream direction (downward in the figure) along an optical axis AX. A two-stage condenser-lens assembly (comprising first and second condenser lenses 2, 3, respectively) is situated downstream of the electron gun 1. The illumination beam passes through the condenser lenses 2, 3 and forms a crossover image C.O. at a blanking aperture 7.

A beam-shaping aperture 4 is situated downstream of the second condenser lens 3. The beam-shaping aperture 4 has a transverse profile (usually square or rectangular) that trims and shapes the illumination beam IB to have a transverse profile and dimensions sufficient to illuminate only one "subfield" on a downstream reticle 10. A "subfield" is a unit of the reticle pattern that is exposed at any instant of time during exposure of the pattern, and thus represents an "exposure unit" of the reticle 10. By way of example, the beam-shaping aperture 4 trims the illumination beam IB to have a square transverse profile measuring just over 1 mm on each side as illuminated on the reticle. An image of the beam-shaping aperture 4 is formed on the reticle 10 by a third condenser lens 9.

The blanking aperture 7 is defined by a plate that, except for the illumination beam IB allowed to pass through the actual blanking aperture, blocks the illumination beam. A blanking deflector 5 is situated between the beam-shaping aperture 4 and the blanking aperture 7. The blanking deflector 5 deflects the illumination beam IB to strike the plate of the blanking aperture 7 (thereby blocking the illumination beam from propagating further downstream) whenever the illumination beam is to be prevented from propagating to the reticle 10.

A subfield-selection deflector 8 is situated downstream of the blanking aperture 7. The subfield-selection deflector 8 illuminates each subfield on the reticle 10 within the field of the illumination-optical system by sequentially or continuously scanning the illumination beam primarily in the left-right direction in FIG. 4 (i.e., in the X-direction). The third condenser lens 9, situated downstream of the subfield-selection deflector 8, collimates the illumination beam for impingement on the reticle. Thus, the illumination beam IB forms an image of the beam-shaping aperture 4 on the reticle 10 whenever the illumination beam strikes the reticle 10.

Even though only one subfield of the reticle 10 is shown (the depicted subfield is centered on the optical axis AX in FIG. 4), it will be understood that the reticle 10 actually comprises multiple subfields arrayed within the X-Y plane extending perpendicularly to the optical axis AX. The reticle 10 normally defines the entire pattern of, for example, a layer of a semiconductor-device chip to be transferred to a substrate ("wafer") 15. Because the reticle 10 is divided into subfields, it is termed a "divided" or "segmented" reticle.

The optical components (lenses and deflectors) discussed above that are situated between the electron gun 1 and the reticle 10 are regarded as components of the "illumination-optical system."

The illumination beam IB is deflected as required by the subfield-selection deflector 8, as discussed above, to illuminate the subfields sequentially or continuously within the field of the illumination-optical system.

The reticle 10 is mounted on a reticle stage 11 to facilitate mechanical movement of the reticle as required in the X- and Y-directions during exposure of the pattern. Thus, subfields located outside the optical field of the illumination-optical system can be moved to within the optical field.

The FIG.-4 apparatus also comprises first and second projection lenses 12, 14, respectively, and a deflector 13 situated downstream of the reticle 10. As the illumination beam strikes a particular subfield on the reticle 10, the portion of the illumination beam passing through the illuminated subfield and propagating downstream of the reticle 10 is denoted the "patterned beam" PB. This is because the beam downstream of the reticle is "patterned" by passing through pattern features, test-pattern features, or alignment-mark features defined in the illuminated region of the reticle 10 and thus acquires the ability to form an image, downstream of the reticle, of the illuminated features. The projection lenses 12, 14 act in concert on the patterned beam PB to prepare the beam for forming the image on the upstream-facing surface of the wafer 15. As the projection lenses 12, 14 converge the patterned beam PB onto the wafer 15, the image carried by the patterned beam is "reduced" (demagnified) for projection onto the wafer 15. By "reduced" or "demagnified" is meant that the image as formed on the wafer 15 is smaller (by an integer reciprocal factor termed the "demagnification ratio") than the corresponding illuminated area on the reticle 10. For each subfield on the reticle 10, the corresponding image is formed at a specified respective location on the wafer 15.

For imprinting of the images on the wafer surface, the upstream-facing surface of the wafer 15 is coated with a suitable "resist." Portions of the resist that receive a dose of charged particles in the patterned beam PB undergo a latent chemical change that is "developed" to reveal the image. A wafer or substrate coated with a non-developed resist is termed "sensitive."

A second crossover C.O. is formed at an axial location at which the axial distance from the reticle 10 to the wafer 15 is divided according to the demagnification ratio. A contrast aperture 18 is located at this second crossover. The contrast aperture 18 blocks electrons of the patterned beam PB that have been scattered by passing through or by non-patterned areas of the reticle 10. Thus, such scattered electrons do not propagate to the wafer 15.

The optical components (lenses and deflectors) discussed above that are situated between the reticle 10 and the wafer 15 are regarded as components of the "projection-optical system."

A backscattered-electron (BSE) detector 19 is situated between the second projection lens 14 and the wafer 15. The BSE detector 19 detects electrons emitted when the patterned beam PB strikes the wafer 15 (which causes some of the electrons of the patterned beam to be emitted in an upstream direction from the wafer 15). The BSE detector 19 produces an electrical signal, corresponding to the electrons, emitted from the wafer 15 and actually received by the detector 19. The signal is routed to a controller 21 via a converter circuit 19a. The converter circuit 19a includes an analog-to-digital (A/D) converter and other appropriate circuitry that converts the signals from the BSE detector 19 to corresponding digital signals that can be processed by the controller 21.

The wafer 15 is mounted, desirably using an electrostatic chuck 16, to a wafer stage 17 that is movable in X-and Y-directions. By appropriately moving the wafer stage 17 synchronously with movements of the reticle stage, wide areas of the pattern as defined on the reticle 10 can be exposed sequentially onto the wafer 15. Due to the image-inversion imparted by the projection lenses 12, 14, the movements of the stages 11, 17 normally are in opposite directions relative to each other. The respective positions of the stages 11, 17 in the X- and Y-directions are determined very accurately using laser interferometers (not shown, but as known in the art).

The various lenses 2, 3, 9, 12, 14 and deflectors 5, 8, 13 are controlled by the controller 21 via respective coil power supplies 2a, 3a, 9a, 12a, 14a, and 5a, 8a, and 13a connected to the controller 21. In addition, the reticle stage 11 and wafer stage 17 are controlled by the controller 21 via stage drivers 11a and 17a, respectively, connected to the controller 21. Finally, the electrostatic chuck 16 is controlled by the main controller 21 via a chuck driver 16a connected to the controller 21. Thus, the respective positions of the stages and respective energizations of the lenses and deflectors are accurately controlled to allow demagnified images of the subfields on the reticle 10 to be stitched together accurately on the wafer 15, thereby forming one or more entire chip patterns on respective regions of the wafer.

Figure 5A:
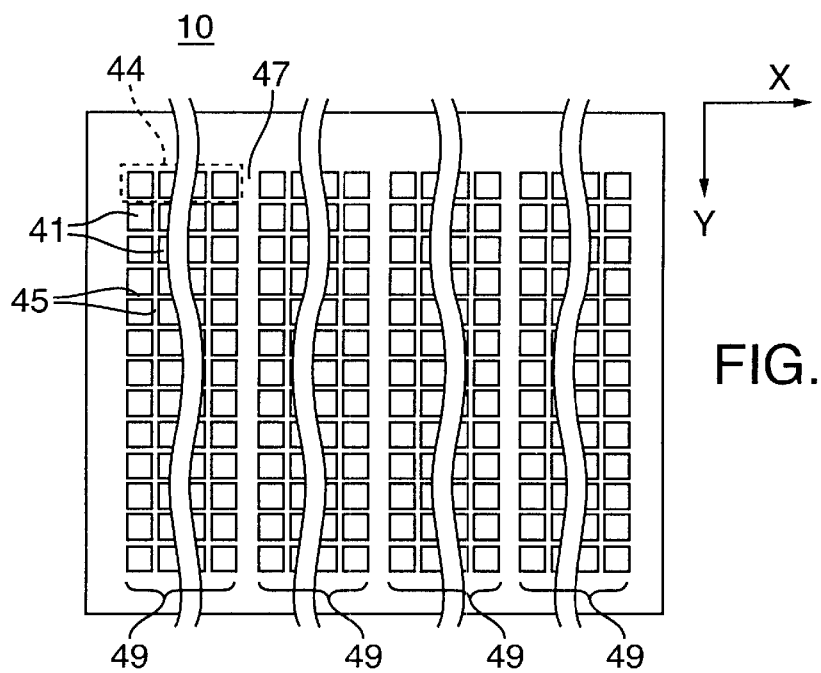
FIGS. 5(*a*)–5(*c*) schematically depict certain features of a representative embodiment of a segmented reticle as used for electron-beam microlithography, wherein FIG. 5(*a*) is a plan view of the overall reticle, FIG. 5(*b*) is a partial oblique view of the reticle, and FIG. 5(*c*) is a plan view of a single subfield of the reticle.
Figure 5B:
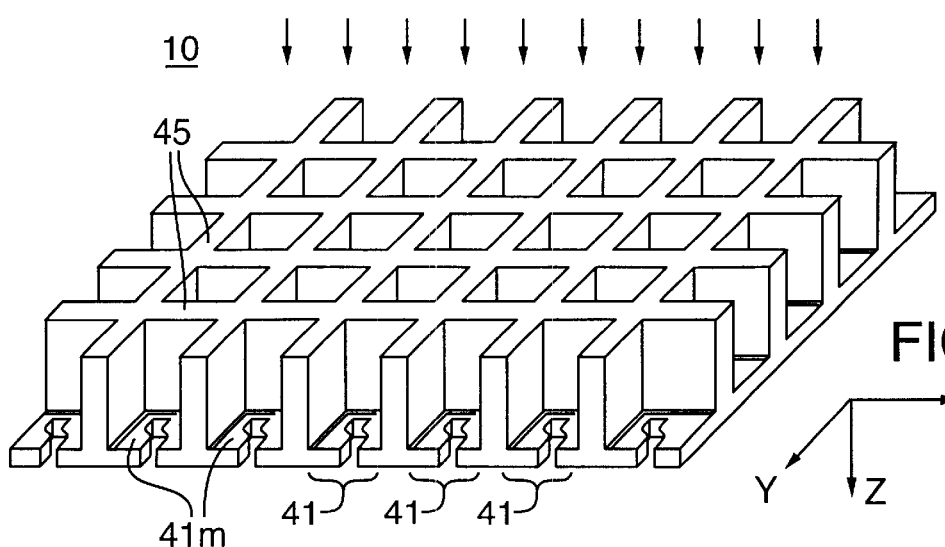
Figure 5C:
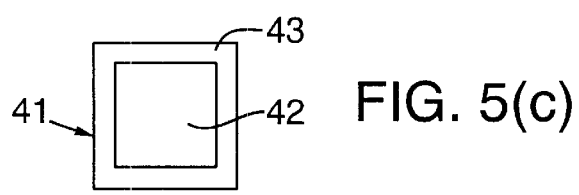

Details of an exemplary reticle 10 as used in the FIG. 4 apparatus are shown in FIGS. 5(a)–5(c). In FIG. 5(a), the reticle 10 comprises multiple "stripes" 49 each containing multiple rows of subfields 41. The rows each extend in the X-direction (representing the width dimension of the corresponding stripes), and the array of rows in each stripe 49 extends in the Y-direction (representing the length dimension of the corresponding stripe). Each row of subfields is termed a "deflection field" 44 because the length of the row (in the X-direction) corresponds to the maximum deflection range (in the X-direction) of the illumination beam as achieved by the subfield-deflection deflector 8 in the illumination-optical system.

As shown in FIG. 5(*b*), each subfield 41 comprises a respective membrane region 41*m*. The thickness (Z-dimension) of each membrane region 41*m* is 0.1 μm to several μm. As shown in FIG. 5(*c*), each subfield 41 comprises a respective patterned region 42 surrounded by a skirt 43 that lacks any pattern features. The patterned region 42 defines the features of the respective portion of the overall pattern defined by the reticle 10. During illumination of a subfield 41, the respective patterned region 42 is illuminated by the illumination beam, wherein the edges of the illumination beam IB fall within the respective skirt 43.

The patterned region 42 of each subfield 41 on the reticle 10 typically has an area (extending in the X- and Y-directions) of approximately 0.5 mm to 5 mm square. At a demagnification ratio of ¹⁄₅, the size of the corresponding image of the subfield as projected onto the wafer 15 is 0.1 mm to 1 mm square.

The reticle includes a grid-like "grillage" 45 comprising intersecting struts that surround each subfield 41. The reticle 10 includes grillage 45 because the membrane regions 41 m are too thin to provide the reticle 10 with any substantial rigidity. Each strut is approximately 0.5 mm to 1 mm thick (in the Z-direction) and approximately 0.1 mm wide in the respective X or Y-direction.

Referring further to FIG. 5(*a*), multiple stripes 49 are arrayed in the X-direction on the reticle 10. Between adjacent stripes 49 and around the perimeter of the reticle 10 are wide struts 47 that provide additional rigidity to the reticle 10. A wide strut 47 situated between adjacent stripes 49 is typically several mm wide (in the X-direction) and has the same thickness (in the Z-direction) as a regular strut located between adjacent subfields 41.

Reticles also can be used in which non-patterned regions (regular struts and skirts 43) do not exist between adjacent subfields 41 in each deflection field 44. I.e., in such a reticle, the patterned regions 42 of adjacent subfields 41 are contiguous within each deflection field 44 of each stripe 49.

Using an apparatus as shown in FIG. 4 and a reticle as shown in FIG. 5(*a*), for projection-exposure of the pattern defined on the reticle 10, the subfields 41 in each deflection field 44 are exposed sequentially by appropriately deflecting the electron beam in the X-direction. As each deflection field 44 is exposed, the next deflection field 44 is moved into position for exposure by appropriately moving (in a scanning manner) the reticle stage 11 and the wafer stage 17. (The stages 11, 17 are moved in opposite directions in the Y-direction.) After completing exposure of a stripe 49, the next stripe 49 is moved into position for exposure by appropriately moving (in a start-and-stop manner) the reticle stage 11 and the wafer stage 17. (The stages 11, 17 are moved in opposite directions in the X-direction.)

As each subfield 41 is projection-exposed onto the wafer 15, the non-patterned portions (skirts 43 and grillage 45) are "canceled" on the wafer so as to place the images of the patterned regions 42 contiguously with each other on the wafer 17. Such placement of the images of the patterned regions 42 on the wafer is termed "stitching" of the images. Upon completing exposure of the entire reticle 10, the corresponding image of a layer of a chip on the wafer comprises all the individual images of the patterned regions 42 stitched together. At a demagnification ratio of ¼ or ⅕, a chip size of 27 mm×44 mm on the wafer (the size of a 4-Gigabit DRAM) would require a reticle measuring (including subfields and non-patterned areas) 120 mm×150 mm to 230 mm×350 mm.

FIG. 1 is a graph showing relationships of the beam-edge resolution 61, a "threshold value" 63 of resist development, and the error in pattern minimum-linewidth dimensions in an instance in which the minimum-linewidth dimensions (i.e., minimum dimensions of patter features) are substantially larger than the beam-edge resolution. The abscissa is position in micrometers. As indicated in the left-hand portion of the graph, the beam-edge resolution A (reference numeral 61 in the figure) is defined as the dimension in which the beam intensity increases from 12% to 88%. As shown in the right-portion of the graph, where the error (variation) of the threshold value is $\epsilon\%$, one half of the pattern-feature positional variation $\delta_{CD}$ (i.e., $\delta_{CD}/2$) is the horizontal-axial dimension between points F and G separated by $\epsilon$ on either side of the threshold value 63 of the beam-intensity curve portion of the beam edge.

If the change in beam intensity between points E and G in FIG. 1 is approximated by a straight line, then the following relationship is obtained from the conditions of similarity of the two triangles EFG and IJK:

$$76:\Delta = \epsilon : \delta_{CD}/2$$

Therefore, $\delta_{CD} = \epsilon \Delta / 38$, wherein $\Delta$ is the beam-edge resolution, $\epsilon$ is the variation in the threshold value, and $\delta_{CD}$ is the variation in pattern-feature position.

Here, even in an instance in which the beam-edge resolution is, for example, $\Delta = 100$ nm (which is too large to form a minimum linewidth of 100 nm), if a strict value of $\epsilon = \pm 1\%$ is inserted, then $\delta_{CD} = 100.2/38 = 5.2$ nm, which is sufficiently less than the permissible linewidth accuracy of ±10% (±10 nm) to form satisfactory pattern features. In other words, if the variation in beam-edge resolution is maintained very tightly at ±1%, then $\delta_{CD} = 5.2$ nm, which causes no problems in accurately forming the pattern. Hence, if the variation of the threshold value is set at the strict value of ±1%, then the poorest beam-edge resolution may be approximately the same as the value of the minimum linewidth.

Representative methods for reducing the variation of the threshold value to approximately ±1% include maintaining the uniformity of the illumination intensity with each subfield at a value that is well within ±1% (e.g., within ±0.2%), reducing the variation in the illumination intensity over time to a value that is much less than ±1% (e.g., ±0.2% or less), and controlling the resist-developing conditions such as the developing temperature, etc. in a strict manner.

Figure 2:
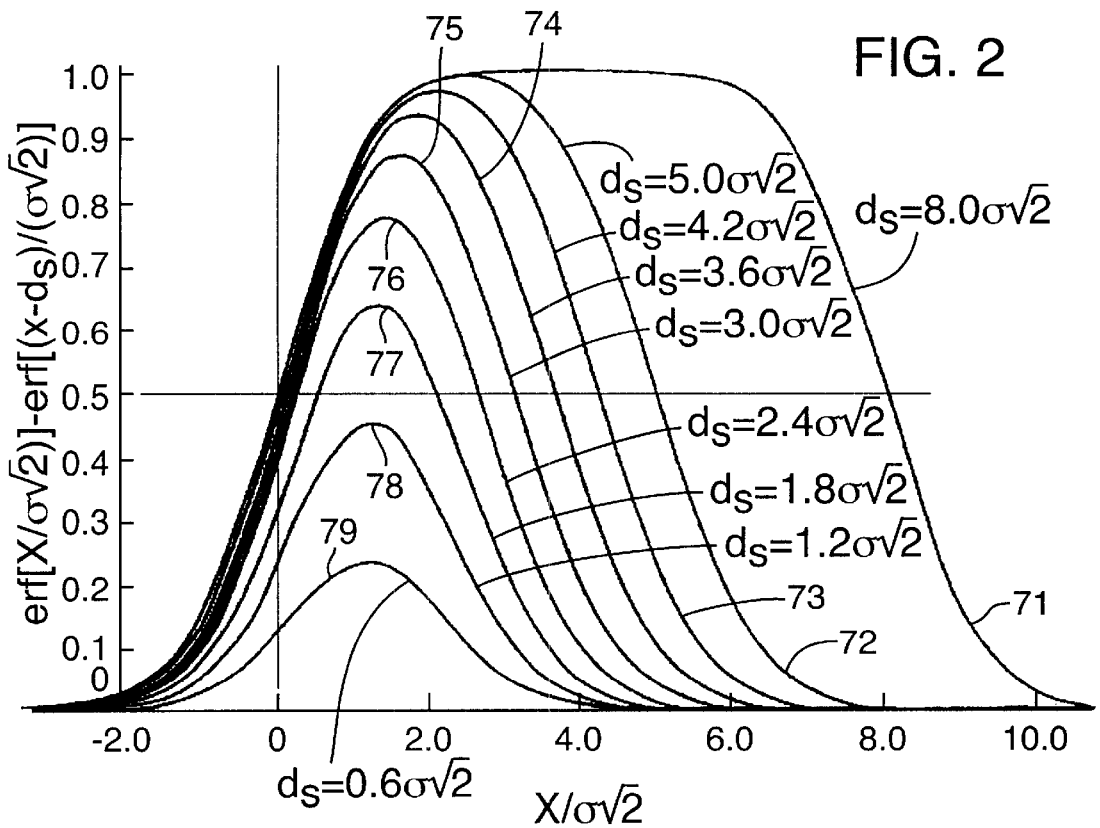
FIG. 2 includes multiple plots of calculated beam-intensity distribution obtained in cases in which the parameters are ideal linewidths, wherein the distributions are expressed as subtractions of two error functions.

Next, an instance in which the minimum linewidth is a value that is close to the beam-edge resolution, or less than the beam-edge resolution, is described with reference to FIG. 2. FIG. 2 shows graphs of calculated beam-intensity distributions obtained for instances in which the ideal linewidth is a key parameter. The distributions are expressed respective differences (subtractions) of two error functions.

The difference in error functions (erf) can be expressed as follows:

$$erf[x/(\sigma/2^{1/2})] - erf[(x - d_s)/\sigma/2^{1/2})]$$

wherein x is the position of a target line, a is the standard deviation of the position, and $d_s$ is the width of an ideal line in a case in which no aberrations are assumed.

Assuming that resist development is performed at a threshold of 50% (i.e., resist development occurs at 50% peak dose; note horizontal line at 0.5 in FIG. 2), then, in a case in which the ideal linewidth is sufficiently large (i.e., in cases in which $d_s=(8.0)\sigma A2^{1/2}$), the detected linewidth is substantially the same as an ideal "design" value of the linewidth (indicated by curve 71 in FIG. 2). Whenever the ideal linewidth is decreased such that $d_s=(2.4)\sigma A2^{1/2}$, the actual pattern-feature linewidth is formed at a slightly smaller value, as indicated by curve 76 in FIG. 2. At $d_s=(1.8)\sigma A2^{1/2}$, a considerable difference is generated between the actual and ideal linewidth, as indicated by curve 77. At $d_s=(1.2)\sigma A2^{1/2}$ or less, no pattern feature is formed on the wafer. This latter instance is indicated by curves 78 and 79 in which no region of either curve resides above the 0.5 line.

Figure 3:
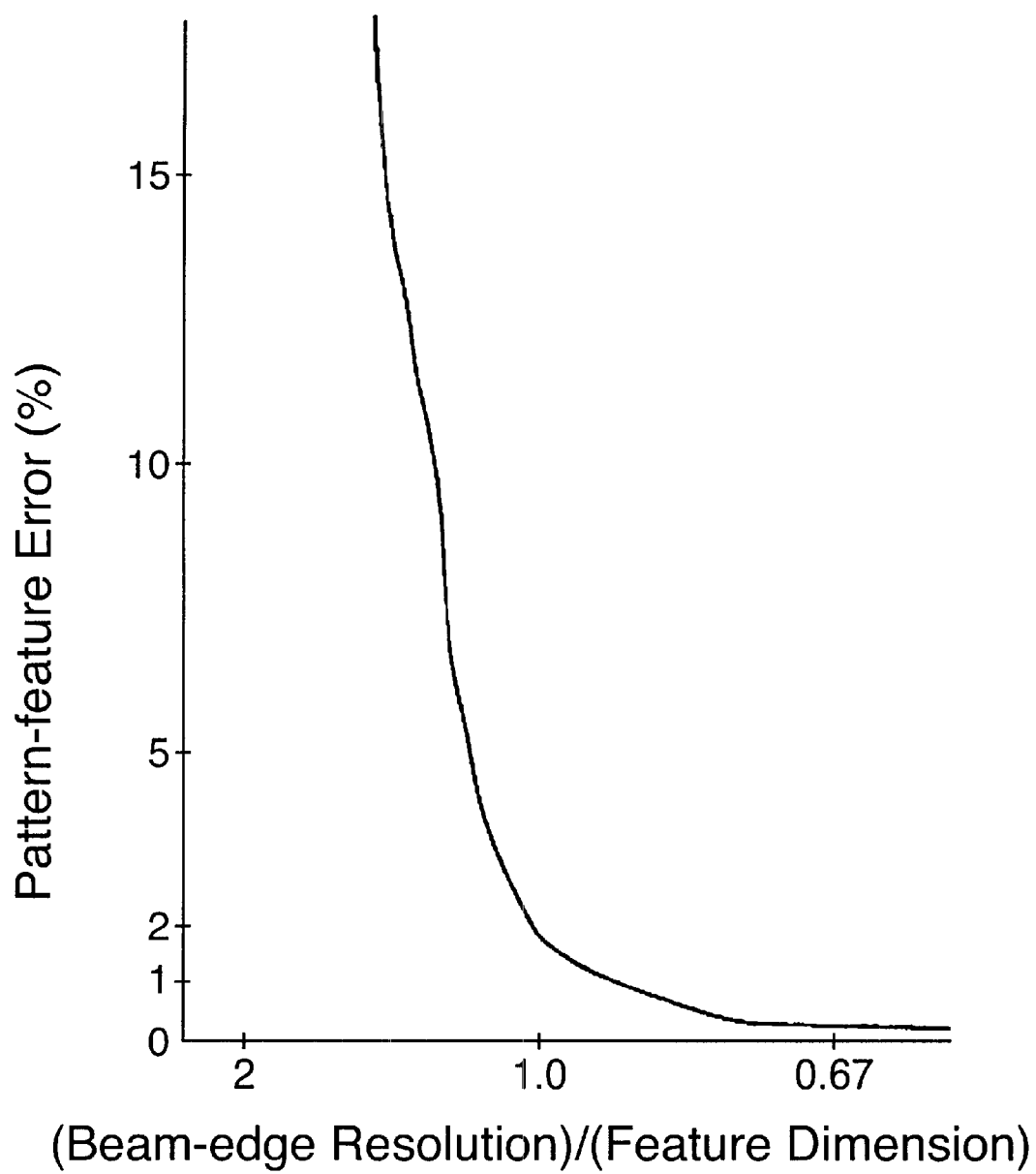
FIG. 3 is a graph showing a representative relationship of a ratio (of beam-edge resolution to pattern-feature dimension) to pattern-feature error.

FIG. 3 is a graph of the results discussed above. In this example, a correct pattern feature was obtained by setting the pattern-feature dimensions at large values beforehand, according to the ratio of minimum pattern linewidth to beam dimension. Specifically, in locations where the beam resolution is poor, such as the periphery of the field, pattern transfer is performed with the pattern-feature dimensions corrected to larger values. For example, in locations in which the beam resolution has the same value as the minimum pattern linewidth, a correction is performed (on the basis of FIG. 3) that increases the pattern-feature dimensions by 1.9% so as to correct for the feature error of 1.9% when the ratio of feature dimension to beam dimension is 1.0.

The beam current desirably is calculated in each of the respective subfields. Also, the extent of blurring caused by the space-charge effect desirably is determined, and a correction desirably is performed that increases the width of the minimum linewidth of the features defined in patterns in the subfields in accordance with the graph shown in FIG. 3.

The dimensions desirably are corrected after calculating a beam-edge resolution that also takes into account the effect of the space-charge effect at the position of the beam trajectory in the field of the CPB-optical system and the position of the subfield on the reticle.

Figure 6:
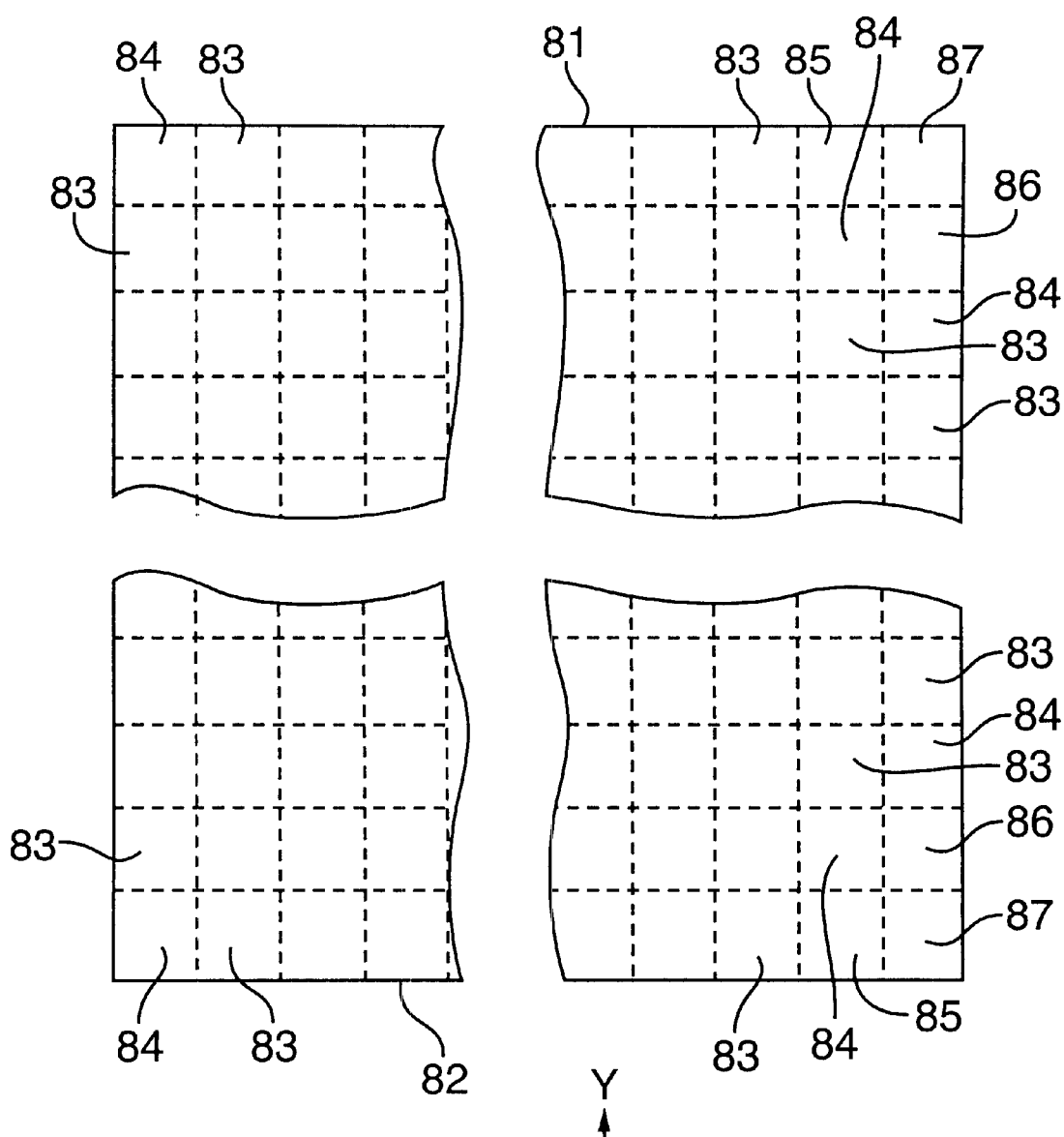
FIG. 6 shows the results of an example calculation of beam blurring in a subfield deflected 2.5 mm in the X-direction, with the area of the 250-$\mu$m square subfield being divided into 25$\mu$m square units.

By way of example, FIG. 6 shows the results of calculations of beam blurring in a subfield deflected 2.5 mm in the X-direction, with the inside of the 250-$\mu$m square subfield divided into 20-$\mu$m square units. The reference numerals 82–87 denote the following:

82: regions in which beam-edge resolution is 50 nm or more
83: regions in which beam-edge resolution is ca. 60 nm
84: regions in which beam-edge resolution is ca. 70 nm
85: regions in which beam-edge resolution is ca. 80 nm
86: regions in which beam-edge resolution is ca. 90 nm
87: regions in which beam-edge resolution is ca. 100 nm For a pattern having a minimum linewidth of 100 nm, the ratios of beam resolution to linewidth dimension are respectively 0.5, 0.6, 0.7, 0.8, 0.9, and 1.0. Accordingly, from FIG. 3, the respective feature-error values are 0.2%, 0.3%, 0.5%, 1.1%, and 1.8%. As a result, 100-nm pattern features of these regions are subjected to respective dimensional corrections as follows: no correction, 100.2 nm, 100.3 nm, 100.5 nm, 101.1 nm, and 101.8 nm.

FIG. 7 is a flow chart of steps in a process for manufacturing a semiconductor device such as a semiconductor chip (e.g., an integrated circuit or LSI device), a display panel (e.g., liquid-crystal panel), or CCD, for example. In step S1, the circuit for the device is designed. In step S2, a reticle ("mask") for the circuit is manufactured. In this step, the effects of beam-blurring can be eliminated or reduced by performing local "resizing" of pattern features. In step S3, a wafer is manufactured from a material such as silicon.

Steps S4–S13 are directed to wafer-processing steps, specifically "pre-process" steps. In the pre-process steps, the circuit pattern defined on the reticle is transferred onto the wafer by microlithography. Step S14 is an assembly step (also termed a "post-process" step) in which the wafer that has been passed through steps S4–S13 is formed into semiconductor chips. This step can include, e.g., assembling the devices (dicing and bonding) and packaging (encapsulation of individual chips). Step S15 is an inspection step in which any of various operability and qualification tests of the device produced in step S14 are conducted. Afterward, devices that successfully pass step S15 are finished, packaged, and shipped (step S16).

Steps S4–S13 also provide representative details of wafer processing. Step S4 is an oxidation step for oxidizing the surface of a wafer. Step S5 involves chemical vapor deposition (CVD) for forming an insulating film on the wafer surface. Step S6 is an electrode-forming step for forming electrodes on the wafer (typically by vapor deposition). Step S7 is an ion-implantation step for implanting ions (e.g., dopant ions) into the wafer. Step S8 involves application of a resist (exposure-sensitive material) to the wafer. Step S9 involves exposing the resist by CPB microlithography, using the reticle produced in step S2, so as to imprint the resist with the reticle pattern, as described elsewhere herein. In step S10, a circuit pattern is exposed onto the wafer using optical microlithography. A proximity-effect-correction exposure that evens out backscattered electrons produced by impingement of the patterned beam on the substrate may be performed either before or after this step. Although this figure shows both CPB and optical microlithography being performed, it alternatively is possible to transfer the entire pattern using only CPB microlithography. Step S11 involves developing the exposed resist on the wafer. Step S12 involves etching the wafer to remove material from areas where developed resist is absent. Step S13 involves resist stripping, in which remaining resist on the wafer is removed after the etching step. By repeating steps S4–S13 as required, circuit patterns as defined by successive reticles are superposedly formed on the wafer.

Hence, according to the invention, variations in beam intensity over time, variations in the position of the field, and variations in developing conditions are maintained at or below 1%. A beam-edge resolution of up to 0.8 to 1.0 times the minimum linewidth being transferred is permitted. Also, variations in the beam-edge resolution of up to 0.8 to 1.0 times the minimum linewidth are also permitted. As a result, a large beam current can be obtained, and transfer with a higher throughput can be achieved, and linewidth accuracy and precision are assured even if beam-edge resolution is relatively poor.

Whereas the invention has been described in connection with a representative embodiment, it will be understood that the invention is not limited to that embodiment. On the contrary, the invention is intended to encompass all modifications, alternatives, and equivalents as may be included within the spirit and scope of the invention as defined by the appended claims.

What is claimed is:

1. A method for performing microlithography of a pattern, defined on a reticle and having a minimum linewidth, to a sensitive substrate using a charged particle beam, comprising:

(a) illuminating a region of the reticle with a charged-particle illumination beam, passing through an illumination-optical system, to form a patterned beam propagating downstream of the reticle;

(b) projecting and focusing the patterned beam, with demagnification, through a projection-optical system onto a corresponding region on a sensitive substrate;

(c) determining a minimum linewidth of the pattern defined by the reticle; and (d) controlling the projection-optical system to provide the patterned beam with a beam-edge resolution that is 0.8 to 1.0 times the minimum linewidth of the pattern.

2. A method for performing microlithography of a pattern, defined on a reticle and having a minimum linewidth, to a sensitive substrate using a charged particle beam, comprising:

(a) dividing the pattern, as defined on the reticle, into multiple subfields;

(b) illuminating the subfields successively with a charged-particle illumination beam to form a patterned beam propagating downstream of the reticle;

(c) projecting and focusing the patterned beam, with demagnification, from each subfield through a projection-optical system so as to form images of the subfields on a respective regions on a sensitive substrate such that the images are stitched together;

(d) calculating a predicted beam-edge resolution of the projection-optical system, based on a beam current used to illuminate each subfield; and (e) before exposing a subfield on the reticle, correcting dimensions of pattern features as defined in the subfield according to a ratio of pattern-feature dimension to the beam-edge resolution, so as to project the pattern features in the subfield with correct pattern-feature dimensions on the substrate.

3. A method for performing microlithography of a pattern, defined on a reticle and having a minimum linewidth, to a sensitive substrate using a charged particle beam, comprising:

(a) dividing the pattern, as defined on the reticle, into multiple subfields;

(b) illuminating the subfields successively with a charged-particle illumination beam to form a patterned beam propagating downstream of the reticle;

(c) projecting and focusing the patterned beam, with demagnification, from each subfield through a projection-optical system so as to form images of the subfields on a respective regions on a sensitive substrate such that the images are stitched together;

(d) calculating a predicted beam-edge resolution of the projection-optical system, based on a beam current used to illuminate each subfield, the calculated beam-edge resolution being calculated as a function of a position, within a field of the projection-optical system, wherein an image of the subfield is to be formed on the substrate; and (e) before exposing a subfield on the reticle, correcting dimensions of pattern features as defined in the subfield according to a ratio of pattern-feature dimension to the beam-edge resolution, so as to project the pattern features in the subfield with correct pattern-feature dimensions on the substrate.

4. In a method for manufacturing an electronic device that includes at least one layer having a pattern formed by charged-particle-beam microlithography, involving illumination of a reticle, defining the pattern, by an illumination beam to form a patterned beam, and transfer of the pattern from the reticle to a sensitive substrate by reducing, projecting, and focusing the patterned beam onto the sensitive substrate, a method for controlling beam blur, comprising:

passing the patterned beam through a projection-optical system as the patterned beam propagates from the reticle to the sensitive substrate;

determining a beam-edge resolution achievable with the projection-optical system; and controlling the projection-optical system such that a poorest beam-edge resolution achieved by the projection-optical system is 0.8 to 1.0 times a minimum linewidth of the pattern.

5. In a method for manufacturing an electronic device that includes at least one layer having a pattern formed by charged-particle-beam microlithography, involving illumination of a reticle, defining the pattern, by an illumination beam to form a patterned beam, and transfer of the pattern from the reticle to a sensitive substrate by reducing, projecting, and focusing the patterned beam onto the sensitive substrate, wherein the reticle is segmented into multiple subfields, each defining a respective portion of the pattern, that are individually and sequentially projected onto the sensitive substrate in a manner in which images of the subfields on the sensitive substrate are stitched together, a method for forming an image on the sensitive substrate of the subfield in which the pattern-feature dimension is correctly formed, comprising:

passing the patterned beam through a projection-optical system as the patterned beam propagates from the reticle to the sensitive substrate;

determining a predicted value of beam-edge resolution of the projection-optical system, the predicted value being determined based on a beam current used to exposed each subfield on the reticle;

before exposing a subfield, correcting a dimension of a pattern feature defined in the subfield, according to a ratio of the pattern-feature dimension to the beam-edge resolution.

6. In a method for manufacturing an electronic device that includes at least one layer having a pattern formed by charged-particle-beam microlithography, involving illumination of a reticle, defining the pattern, by an illumination beam to form a patterned beam, and transfer of the pattern from the reticle to a sensitive substrate by reducing, projecting, and focusing the patterned beam onto the sensitive substrate, wherein the reticle is segmented into multiple subfields, each defining a respective portion of the pattern, that are individually and sequentially projected onto the sensitive substrate in a manner in which images of the subfields on the sensitive substrate are stitched together, a method for forming an image of a subfield in which pattern-feature dimensions are correct, comprising:

passing the patterned beam through a projection-optical system as the patterned beam propagates from the reticle to the sensitive substrate;

determining a predicted value of beam-edge resolution of the projection-optical system, the value being a function of a position, within a field of the projection-optical system where the subfield pattern is transferred; and based on the determination and before projecting an image of a subfield, correcting dimensions of the pattern features in the subfield, according to a ratio of pattern-feature dimension to beam-edge resolution.

7. A semiconductor-fabrication process, comprising the steps of:

(a) preparing a wafer;

(b) processing the wafer; and (c) assembling devices formed on the wafer during steps (a) and (b), wherein step (b) comprises the steps of (i) applying a resist to the wafer; (ii) exposing the resist; (iii) developing the resist; and (iv) annealing the resist; and step (ii) comprises performing microlithography as recited in claim 1 to expose the resist with the pattern defined on the reticle.

8. A semiconductor device produced by the method of claim 7.

9. A semiconductor-fabrication process, comprising the steps of:

(a) preparing a wafer;

(b) processing the wafer; and (c) assembling devices formed on the wafer during steps (a) and (b), wherein step (b) comprises the steps of (i) applying a resist to the wafer; (ii) exposing the resist; (iii) developing the resist; and (iv) annealing the resist; and step (ii) comprises performing microlithography as recited in claim 2 to expose the resist with the pattern defined on the reticle.

10. A semiconductor device produced by the method of claim 9.

11. A semiconductor-fabrication process, comprising the steps of:

(a) preparing a wafer;

(b) processing the wafer; and (c) assembling devices formed on the wafer during steps (a) and (b), wherein step (b) comprises the steps of (i) applying a resist to the wafer; (ii) exposing the resist; (iii) developing the resist; and (iv) annealing the resist; and step (ii) comprises performing microlithography as recited in claim 3 to expose the resist with the pattern defined on the reticle.

12. A semiconductor device produced by the method of claim 11.

* * * * *

UNITED STATES PATENT AND TRADEMARK OFFICE
CERTIFICATE OF CORRECTION

PATENT NO. : 6,337,164 B1
DATED : January 8, 2002
INVENTOR(S) : Mamoru Nakasuji

It is certified that error appears in the above-identified patent and that said Letters Patent is hereby corrected as shown below:

Title page,
Item [56], References Cited, please insert -- OTHER PUBLICATIONS
Nakasuji et al., J. VAc. Sci. Techol. --

Column 8,
Line 8, "patter" should be -- pattern --.
Line 11, "A" should be -- $\Delta$ --
Line 62, "a" should be -- $\sigma$ --

Signed and Sealed this

Twenty-seventh Day of May, 2003

JAMES E. ROGAN
*Director of the United States Patent and Trademark Office*